US008871363B2

(12) United States Patent
Tsuchiya et al.

(10) Patent No.: US 8,871,363 B2
(45) Date of Patent: Oct. 28, 2014

(54) RESISTOR FILM FOR BOLOMETER

(75) Inventors: Tetsuo Tsuchiya, Ibaraki (JP); Masami Nishikawa, Ibaraki (JP); Tomohiko Nakajima, Ibaraki (JP); Toshiya Kumagai, Ibaraki (JP); Takaaki Manabe, Ibaraki (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 123 days.

(21) Appl. No.: 13/393,556

(22) PCT Filed: Sep. 1, 2010

(86) PCT No.: PCT/JP2010/064910
§ 371 (c)(1),
(2), (4) Date: Mar. 29, 2012

(87) PCT Pub. No.: WO2011/027774
PCT Pub. Date: Mar. 10, 2011

(65) Prior Publication Data
US 2012/0196150 A1     Aug. 2, 2012

(30) Foreign Application Priority Data
Sep. 3, 2009   (JP) ................. 2009-203691

(51) Int. Cl.
*B32B 5/14* (2006.01)
*B32B 9/00* (2006.01)

(52) U.S. Cl.
CPC .......... *H01C 17/06533* (2013.01); *C01G 31/02* (2013.01); *G01J 5/20* (2013.01); *C01P 2002/02* (2013.01); *C01P 2002/04* (2013.01); *H01C 7/026* (2013.01); *C01P 2006/90* (2013.01); *C01P 2002/80* (2013.01); *G01J 5/024* (2013.01); *G01J 5/046* (2013.01)

USPC .......... 428/702; 428/610; 428/615; 428/632; 423/594.17; 338/22 R; 250/332; 250/338.1; 427/596; 427/554; 427/383.1; 427/419.1

(58) Field of Classification Search
None
See application file for complete search history.

(56) References Cited

U.S. PATENT DOCUMENTS

| | | | |
|---|---|---|---|
| 6,624,384 B2 | 9/2003 | Tsuchiya et al. | |
| 7,781,030 B2 | 8/2010 | Tsuchiya et al. | |
| 8,228,159 B1 * | 7/2012 | Coffey et al. ............... | 338/22 R |

FOREIGN PATENT DOCUMENTS

| | | | |
|---|---|---|---|
| JP | 01-294306 A | 11/1989 | |
| JP | 01294306 | * 11/1989 | ............... H01B 5/14 |

(Continued)

OTHER PUBLICATIONS

Fieldhouse et al. "Vanadium oxide thin films for bolometric applications deposited by reactive pulsed dc sputtering" Jun. 30, 2009, J. Vac. Sci. Technol. A, vol. 27, pp. 951-955.*

(Continued)

*Primary Examiner* — Gwendolyn Blackwell
*Assistant Examiner* — Seth Dumbris
(74) *Attorney, Agent, or Firm* — Howson & Howson LLP

(57) ABSTRACT

Provided is a resistor film comprising vanadium oxide as a main component, wherein metal-to-insulator transition is indicated in the vicinity of room temperature in temperature variations of electric resistance, there is no hysteresis in a resistance change in response to temperature variations or the temperature width is small at less than 1.5K even if there is hysteresis, and highly accurate measurement can be provided when used in a bolometer.

Upon producing the resistor film comprising vanadium oxide as a main component by treating a coating film of an organo-vanadium compound via laser irradiation or the like, a crystalline phase and a noncrystalline (amorphous) phase are caused to coexist in the resistor film.

15 Claims, 6 Drawing Sheets

(51) Int. Cl.
*C01G 31/02* (2006.01)
*G01J 5/20* (2006.01)
*H01C 3/04* (2006.01)
*H01C 17/065* (2006.01)
*H01C 7/02* (2006.01)
*G01J 5/02* (2006.01)
*G01J 5/04* (2006.01)

(56) References Cited

FOREIGN PATENT DOCUMENTS

| JP | 11-271145 A | | 10/1999 | |
| JP | 2001-146423 A | | 5/2001 | |
| WO | WO2009/131674 | * | 10/2009 | ............... G01K 7/13 |
| WO | WO2009/134810 | * | 11/2009 | ............. C23C 14/08 |

OTHER PUBLICATIONS

Nishikawa et al. "High temperature coefficients of resistance of VO2 films grown by excimer-laser-assisted metal organic deposition process for bolometer application", Jun. 2, 2010, Materials Letters, vol. 64, pp. 1921-1924.*

* cited by examiner

RESISTOR FILM FOR BOLOMETER

TECHNICAL FIELD

The present invention relates to a resistor film comprising vanadium oxide as a main component, which is suitable for use in a bolometer. More specifically, the present invention relates to a resistor film in which its temperature coefficient of resistance in the vicinity of room temperature is 4%/K or higher, there is no hysteresis or, the temperature width is small even if there is hysteresis, and highly accurate measurement can be provided when used in a bolometer.

BACKGROUND ART

A thin film for bolometer that is used as an uncooled infrared sensor: is made of a metal thermally-isolated from a circuit board such as a Si substrate, a semiconductor or the like; and functions as an element, in which the temperature changes by absorbing the incoming infrared light, the electric resistance changes in response to such temperature variations, and the intensity of the incoming infrared light is detected thereby. Generally speaking, with this bolometer material, when the temperature coefficient of electric resistance (temperature coefficient of resistance is hereinafter referred to as "TCR", and the following numerical value, small and large, and high and low of the TCR are all represented as absolute values excluding those in the drawings) increases, the noise equivalent temperature difference (NETD) of the infrared sensor decreases and the sensitivity will improve.

Today, a vanadium oxide thin film having a TCR of 2%/K is being used as a resistor film for a bolometer for use in an infrared sensor, but a material which indicates a higher TCR is being demanded. As such material that is indicative on a high TCR, a perovskite-type Mn oxide thin film is known. This thin film shows significant change in electric resistance, in the vicinity of 300K, associated with metal-to-insulator transition that is unique to this material, and a large TCR of roughly 10%/K can be obtained in the vicinity of 300K pursuant to the forgoing phase transition (Patent Document 1). Nevertheless, the TCR of 4%/K or higher is only indicated around ±5K in the vicinity of room temperature, and there is a problem in that the temperature range, for ordinary use as a bolometer thin film, is too narrow.

Meanwhile, various experiment and research have also been conducted with vanadium oxide films in order to achieve a higher TCR.

Non-Patent Document 1 describes that, when vanadium oxide is crystallized, a high TCR can be obtained pursuant to metal-to-insulator transition, and this results in hysteresis having a large resistance change in response to temperature variations. Nevertheless, if there is hysteresis having a large resistance change in response to temperature variations, it cannot be used as is as a bolometer thin film of an infrared sensor, and crystallized vanadium oxide that is indicative of a high TCR cannot ordinarily be used as a bolometer thin film. Thus, a film, in which an amorphous vanadium oxide film is produced through sputtering, and the electric resistance is controlled by partially reducing vanadium oxide thereafter, is used in an infrared sensor. The temperature variations of resistance in the foregoing case are semiconductive, and the TCR is low at roughly 2%/K.

Patent Document 3 describes a detector film for a bolometer having a crystallized vanadium oxide layer on an insulating substrate, wherein phase transition and hysteresis can be avoided by orienting the c axis of the vanadium oxide crystals in a direction perpendicular to the surface of the insulating substrate, and the foregoing crystalline orientation can be obtained stably by using a vanadium oxide layer containing nitrogen. Nevertheless, the TCR in the Examples is still a low value which is, at maximum, 2.79%/K. Accordingly, there is still no known vanadium oxide resistor film, which has a high TCR of 4%/K or higher in the vicinity of room temperature, and is free from large hysteresis in a resistance change in response to temperature variations.

With respect to a method of producing a vanadium oxide resistor film for use in a bolometer, Patent Document 1 describes that a solution of an organovanadium compound is applied on a support medium, laser light having a wavelength of 400 nm or less is irradiated onto this support medium after being dried, and the organovanadium compound is decomposed to obtain a crystallized vanadium oxide thin film.

Moreover, Patent Document 2 describes that the amorphous film is irradiated by ultraviolet laser in a reducing atmosphere, and a vanadium oxide resistor film, in which there is no hysteresis in temperature variations of resistance and the TCR is roughly 3%/K, can be thereby obtained so as to overcome the problem of the protracted treatment of reducing vanadium oxide, which is adopted for optimizing the electric resistance of the vanadium oxide resistor film.

Nevertheless, there is no conventional technology to produce, by irradiating laser light or ultraviolet light, a vanadium oxide resistor film, which has a high TCR of 4%/K or higher and is free from large hysteresis in a resistance change in response to temperature variations.

PRIOR ART DOCUMENTS

[Patent Document 1] Japanese Laid-Open Patent Publication No. 2002-289931
[Patent Document 2] Japanese Laid-Open Patent Publication No. 2007-225532
[Patent Document 3] Japanese Laid-Open Patent Publication No. H11-271145
[Non-Patent Document 1] H. Miyazaki et al. Appl. Surf. Sci., 252, (2006) 8367

SUMMARY OF INVENTION

With the foregoing prior art as the background, an object of the present invention is to provide a resistor film comprising vanadium oxide as a main component, in which there is no hysteresis in a resistance change in response to temperature variations or the temperature width is small even if there is hysteresis, and the TCR in the vicinity of room temperature is 4%/K or higher.

Moreover, the present invention also aims to provide a resistor film comprising vanadium oxide as a main component, which enables highly accurate measurement when used in a bolometer.

In addition, the present invention further aims to provide a high-precision detector film, which includes the foregoing resistor film and a substrate to support the resistor film, and is for use in a bolometer, a temperature sensor, a thermosensitive sensor or the like.

The present inventors acquired the following discovery by reviewing the prior arts described above and conducting numerous experiment and research.

When a crystalline phase and an noncrystalline (amorphous) phase coexist in a vanadium oxide resistor film, the TCR value will slightly decrease in comparison to a case where the film is entirely of a crystalline phase, but the TCR becomes 4%/K or higher in the vicinity of room temperature, and there is no hysteresis in a resistance change in response to temperature variations or the temperature width of hysteresis is small at less than 1.5K even if there is hysteresis. Although the specific reason thereof is unclear; it would appear that, when a crystalline portion and a noncrystalline (amorphous) portion coexist in the vanadium oxide resistor film, metal-to-insulator transition is indicated as with a case where the film is completely crystallized, and the TCR value is smaller than a case where the film is completely crystallized, but it is considerably greater than a case where the film becomes semiconductive. With respect to the hysteresis of the resistance change in response to temperature variations, it would appear that, as in a case where the film becomes semiconductive, there is no hysteresis or the temperature width thereof is extremely small at less than 1.5K even if there is hysteresis.

The present invention was devised based on the foregoing discovery.

Specifically, the present invention is characterized in the following.

1. A resistor film comprising vanadium oxide as a main component, wherein a crystalline phase and a noncrystalline phase exist in the film.
2. The resistor film comprising vanadium oxide as a main component according to 1 above, wherein the crystalline phase is formed at the side near a base material supporting the resistor film, and the noncrystalline phase is formed at the surface side.
3. The resistor film comprising vanadium oxide as a main component according to 1 or 2 above, wherein a gradient structure of the crystalline phase and the noncrystalline phase exists at the boundary of the phases.
4. A resistor film comprising vanadium oxide as a main component, wherein metal-to-insulator transition is indicated in the vicinity of room temperature in temperature variations of electric resistance, and there is no hysteresis in a resistance change in response to temperature variations or the temperature width is less than 1.5K even if there is hysteresis.
5. A resistor film comprising vanadium oxide as a main component, wherein there is no hysteresis in the resistance change in response to temperature variations or the temperature width is less than 1.5K even if there is hysteresis, and its temperature coefficient of resistance in a temperature range of 280K to 320K is 4%/K or higher.
6. The resistor film comprising vanadium oxide as a main component according to any one of 1 to 3 above, wherein metal-to-insulator transition is indicated in the vicinity of room temperature in temperature variations of electric resistance, and there is no hysteresis in a resistance change in response to temperature variations or the temperature width is less than 1.5K even if there is hysteresis.
7. A bolometer comprising the resistor film according to any one of 1 to 6 above.
8. A temperature sensor comprising the resistor film according to any one of 1 to 6 above.
9. A method of producing the resistor film according to any one of 1 to 6 above, wherein a coating film of an organovanadium compound is subject to one or more treatments selected from ultraviolet irradiation treatment using an ultraviolet lamp, heat treatment, plasma irradiation treatment, and laser irradiation treatment.
10. The method of producing the resistor film according to 9 above, wherein the coating film of an organovanadium compound is subject to any of ultraviolet irradiation treatment using an ultraviolet lamp, heat treatment or plasma irradiation treatment, and thereafter it is further subject to laser irradiation treatment.

11. A method of producing the resistor film according to 2 above, wherein a crystalline phase-based lower layer comprising vanadium oxide as a main component is formed, and a noncrystalline phase-based upper layer comprising vanadium oxide as a main component is thereafter formed on the crystalline phase-based lower layer.
12. The method of producing the resistor film according to 11 above, wherein a coating film of an organovanadium compound is subject to one or more treatments selected from ultraviolet irradiation treatment using an ultraviolet lamp, heat treatment, plasma irradiation treatment, and laser irradiation treatment so as to form a crystalline phase-based lower layer comprising vanadium oxide as a main component, a coating film of an organovanadium compound is thereafter formed on the crystalline phase-based lower layer, and the coating film is subject to one or more treatments selected from ultraviolet irradiation treatment using an ultraviolet lamp, heat treatment, plasma irradiation treatment, and laser irradiation treatment so as to form a noncrystalline phase-based upper layer comprising vanadium oxide as a main component.
13. A detector film including the resistor film according to any one of 1 to 6 above and a substrate which supports the resistor film.
14. The detector film according to 13 above, wherein the substrate material is any one of single crystalline or oriented polycrystalline sapphire, titanium oxide, and tin oxide.
15. The detector film according to 13 or 14 above, wherein the method of producing the detector film includes a process of irradiating ultraviolet light or plasma onto an organovanadium compound coating film on the substrate surface to decompose the organic constituent and obtain a noncrystalline phase-based film.
16. The detector film according to 15 above, wherein the method of producing the detector film includes a process of irradiating laser onto the noncrystalline phase-based film.

EFFECTS OF INVENTION

According to the present invention, it is possible to provide a resistor film which is suitable for mass production and has high TCR, and in which there is no hysteresis in a resistance change in response to temperature variations or the temperature width of hysteresis is small at less than 1.5K even if there is hysteresis, and highly accurate measurement can be provided when used in a bolometer, a temperature sensor or the like.

DESCRIPTION OF EMBODIMENTS

Figure 1:
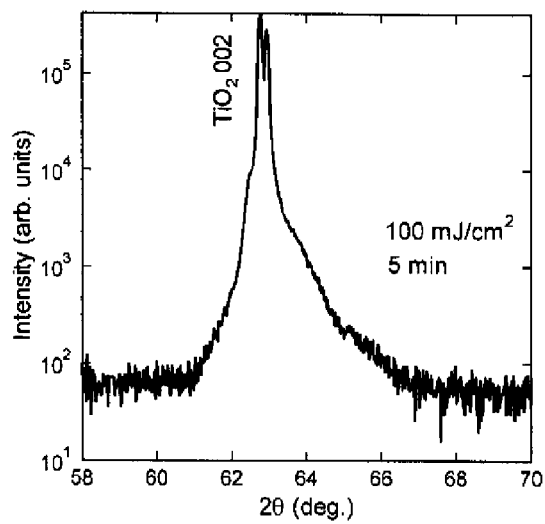
FIG. 1 This is an X-ray diffraction diagram of the vanadium oxide resistor film of Example 1.

The resistor film comprising vanadium oxide as a main component according to the present invention is unique in that a crystalline phase and a noncrystalline phase exist in the film. As to this resistor film, based on this kind of structure of including a crystalline phase and a noncrystalline phase, there is no hysteresis in a resistance change in response to temperature variations or the temperature width thereof is small even if there is hysteresis, and it is indicative of a higher TCR than a case where semiconductive resistance change is indicated along with the metal-to-insulator transition in the vicinity of room temperature.

Moreover, the resistor film comprising vanadium oxide as a main component according to the present invention is unique in that metal-to-insulator transition is indicated in the vicinity of room temperature in temperature variations of electric resistance, and there is no hysteresis in a resistance change in response to temperature variations or the temperature width thereof is less than 1.5K even if there is hysteresis. This resistor film is indicative of a higher TCR than a case where semiconductive resistance change is indicated along with the metal-to-insulator transition in the vicinity of room temperature.

In addition, the resistor film comprising vanadium oxide as a main component according to the present invention is unique in that there is no hysteresis in the resistance change in response to temperature variations or the temperature width thereof is less than 1.5K even if there is hysteresis, and its temperature coefficient of resistance in a temperature range of 280K to 320K is 4%/K or higher.

Although there is no particular limitation regarding the maximum temperature coefficient of resistance of the resistor film; with the resistor film of the present invention, it will normally be smaller than a crystallized film. The maximum temperature coefficient of resistance of the resistor film of the present invention is preferably 9%/K or higher, but if it becomes excessively large, the temperature range in which the temperature coefficient of resistance is 4%/K or higher will become narrow, and the desirable upper limit is around 15%/K.

The foregoing metal-to-insulator transition can be observed, in the temperature (K) against resistance ($\Omega$cm based on a common logarithm) diagram showing a resistance change in response to temperature variations, as a change of $1/100$ (Log $\Omega$cm/K) or more of the inclination in the vicinity of room temperature. Moreover, the expression "metal-to-insulator transition is indicated in the vicinity of room temperature" means that the inflection point associated with the foregoing inclination change exists within the range of 280 to 320K.

Moreover, in the present invention, the term "temperature width of hysteresis" is defined as follows. Foremost, the temperature indicating the maximum value in the differential curve $(d[-\log(\rho)]/dT)$ of resistivity $\rho$ in the heating process was determined to be the center temperature in the heating process of the metal-to-insulator transition. Subsequently, the temperature upon once again reaching, in the cooling process, the resistivity relative to the center temperature in the foregoing heating process was measured, and the difference between this temperature and the foregoing center temperature was defined as the "temperature width of hysteresis".

A resistor film for use in a bolometer is normally required to have an electric resistivity within a range of 0.1 to 10 $\Omega$cm in the vicinity of a temperature of 275 to 320K, and the resistor film according to the present invention also falls within the range of the foregoing electric resistivity.

Desirably, the material of the resistor film according to the present invention is vanadium oxide alone, but it may also contain other components without departing from the foregoing physical properties in the present invention. As such other components, in addition to the nitrogen described in Patent Document 3, used may be metal elements such as Cr, Mn and Fe which can be substituted for a part of vanadium in aim for the change in the phase transition temperature or the improvement of TCR.

The foregoing physical properties of the resistor film according to the present invention are yielded as a result of having a crystalline phase and a noncrystalline (amorphous) phase in the resistor film comprising vanadium oxide as a main component. This was discovered by the present inventors. Specifically, if the entire vanadium oxide film is of a crystalline phase, as described above, it will be indicative of metal-to-insulator transition and a large TCR can be obtained pursuant to the phase transition, but it will also be indicative of large hysteresis in temperature variations of resistance. Meanwhile, if noncrystalline vanadium oxide becomes semiconductive by hysteresis in temperature variations of resistance, but the TCR will become a small value of roughly 2%/K. Meanwhile, with the present invention, it was discovered that the foregoing desirable physical properties as a bolometer could be obtained by having a crystalline phase and a noncrystalline phase in the resistor film. As a desirable structure, for instance, used may be a structure where a crystalline phase is formed at the side near the base material supporting the resistor film, and a noncrystalline phase is formed at the surface side of the resistor film. The resistor film according to the present invention may have a gradient structure of the crystalline phase and the noncrystalline phase at the boundary of these phases, or may have a clear boundary to be formed between both phases.

The resistor film according to the present invention may be produced so as to possess the foregoing structure, and any production method may be adopted. As an example of such production methods, a coating film of an organovanadium compound may be subject to one or more treatments selected from ultraviolet irradiation treatment using an ultraviolet lamp, heat treatment, plasma irradiation treatment, and laser irradiation treatment to decompose the organovanadium compound, and thereby form a vanadium oxide film.

As the organovanadium compound, there is no particular limitation so long as it can absorb ultraviolet light and will dissolve in the solvent but with not much progress of the hydrolysis reaction in the atmosphere. As this kind of organovanadium compound, for example, organic vanadate, β-diketonate vanadium complex, vanadium alkoxide which will not cause a hydrolysis reaction, or the like may be used. As the organic vanadate, vanadium acetate, vanadium 2-ethylhexanoate, vanadium naphthenate or the like may be used. As the β-diketonate vanadium complex, vanadium acetylacetonate or the like may be used.

As the base material such as a substrate to which the organovanadium compound is applied and which can be used as a support medium of the bolometer film, there is no particular limitation so long as it is an insulating material, but, for example, single crystalline or oriented polycrystalline sapphire, titanium oxide, tin oxide or the like may be used. Among the above, a single crystalline film or oriented polycrystalline film of titanium oxide is preferable. In the case of a bolometer thin film that is used as an uncooled infrared sensor, the bolometer thin film is normally formed on the surface of a bridge structure of titanium oxide or the like that is formed on the Si substrate via a gap.

By adjusting a combination of treatments such as the ultraviolet irradiation treatment using an ultraviolet lamp, heat treatment, plasma irradiation treatment, and laser irradiation treatment to be performed on the coating film of an organovanadium compound, the treatment time, and the like; the mixed structure of the crystalline phase and the noncrystalline phase as described above can be obtained. As a combination example of the foregoing treatments, it is possible to perform treatment via any of ultraviolet irradiation treatment using an ultraviolet lamp, heat treatment at 300° C. or less, and plasma irradiation treatment, and thereafter perform laser irradiation treatment. In the case of the foregoing combination, a part or all of the organic constituent is decomposed in the initial treatment to obtain a noncrystalline-based film, and the remaining organic constituent is decomposed in the subsequent laser irradiation to partially form a crystalline phase.

As the laser light to be used in the laser irradiation, laser light having a wavelength within the range of 157 to 550 nm, particularly ultraviolet laser with a small heating effect, can be used. As this type of laser, for example, excimer laser such as XeF (351 nm), XeCl (308 nm), KrF (248 nm), ArF (193 nm) and $F_2$ (157 nm), Ar ion laser (second harmonic: 257 nm) or the like may be used. In particular, ultraviolet laser light having a wavelength within the range of 222 to 360 nm is preferable from the perspective that changes in the material properties can be made uniform.

The irradiation energy of the foregoing laser light needs to be adjusted to be within a range where the entire resistor film comprising vanadium oxide as a main component does not become a crystalline phase, and a noncrystalline (amorphous) phase portion remains. Although the optimal irradiation energy will differ depending on the wavelength of the laser, when using a laser of 248 nm, a preferable range is 5 to 150 mJ/cm$^2$, and a more preferable range is 5 to 60 mJ/cm$^2$.

The temperature of the base material upon irradiating the foregoing laser light will suffice if it is within a range where the entire resistor film will not become a crystalline phase, and is preferably room temperature.

Irradiation of the foregoing laser light is desirably performed in the atmosphere, but the irradiation can also be performed in the atmosphere and subsequently performed in a vacuum or reducing mixed gas atmosphere in order to adjust the resistance. As the reducing mixed gas, $H_2$, $NH_3$, $N_2O$ or the like may be used.

The irradiation time of the foregoing laser light will differ depending on the laser wavelength, laser energy, and repetition frequency, but it is 1 second to 2 hours, and preferably 1 second to 30 minutes. Although the irradiation time is roughly 10 minutes to 30 minutes with existing lasers, there are cases where it is anticipated that irradiation of roughly 2 hours will be optimal for lasers with a low output.

The foregoing method is for obtaining a mixed structure of a crystalline phase and a noncrystalline phase by treating one coating film of an organovanadium compound, and a gradient structure of these phases is normally formed at the boundary of the crystalline phase and the noncrystalline phase.

Aside from the foregoing method, it is also possible to obtain the resistor film of the present invention, comprising vanadium oxide as a main component and having a crystalline phase and a noncrystalline phase in the film, by forming a crystalline phase-based lower layer, and thereafter forming a noncrystalline phase-based upper layer on the crystalline phase-based layer. With this method, formed is a resistor film having a relatively clear boundary of the crystalline phase and the noncrystalline phase. As a specific method thereof, for example, a coating film of an organovanadium compound is subject to one or more treatments selected from ultraviolet irradiation treatment using an ultraviolet lamp, heat treatment, plasma irradiation treatment, and laser irradiation treatment so as to form a crystalline phase-based lower layer comprising vanadium oxide as a main component, another coating film of an organovanadium compound is thereafter formed on the crystalline phase-based lower layer, and the coating film is subject to one or more treatments selected from ultraviolet irradiation treatment using an ultraviolet lamp, heat treatment, plasma irradiation treatment, and laser irradiation treatment so as to form a noncrystalline phase-based upper layer comprising vanadium oxide as a main component. The formation of the crystalline phase-based lower layer comprising vanadium oxide as a main component via one or more treatments of ultraviolet irradiation treatment, heat treatment, plasma irradiation treatment, and laser irradiation treatment can be realized by selecting a treatment or a combination thereof that achieves faster crystallization or prolonging the treatment time in comparison to the case of obtaining a mixed structure of a crystalline phase and a noncrystalline phase by treating one coating film. Moreover, the formation of the noncrystalline phase-based upper layer via one or more treatments of ultraviolet irradiation treatment, heat treatment, plasma irradiation treatment, and laser irradiation treatment can be realized by selecting a treatment or a combination thereof that achieves slower crystallization or shortening the treatment time in comparison to the case of obtaining a mixed structure of a crystalline phase and a noncrystalline phase by treating one coating film.

EXAMPLES

The present invention is now explained in further detail based on the following Examples, but the present invention shall not be limited in any way by such Examples.

Example 1

Figure 2:
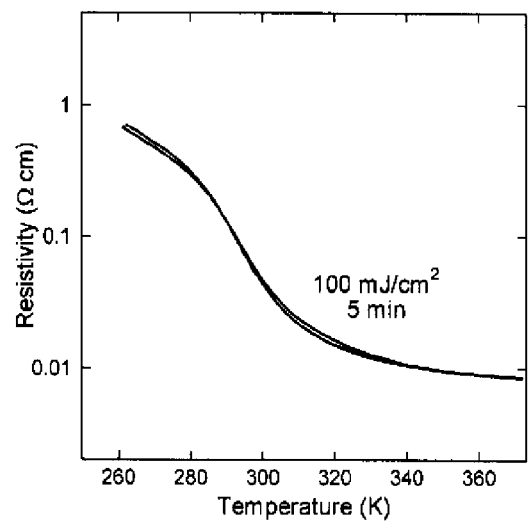
FIG. 2 This is a diagram showing the temperature-based resistance change of the vanadium oxide resistor film of Example 1.
Figure 3:
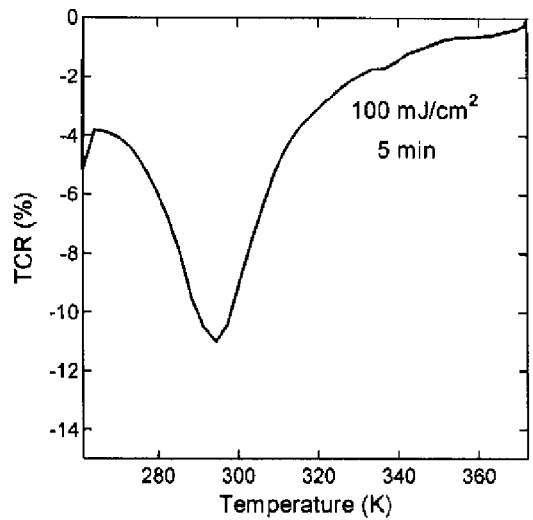
FIG. 3 This is a diagram showing the temperature-based TCR change of the vanadium oxide resistor film of Example 1.
Figure 4:
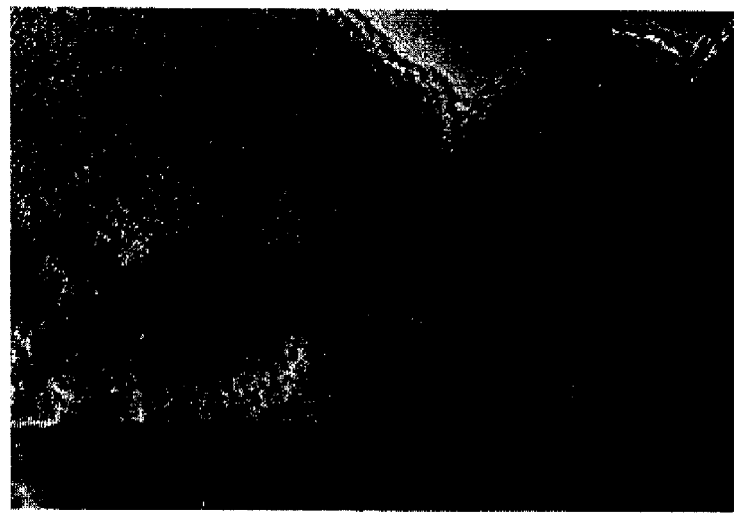
FIG. 4 This is a diagram showing the cross-section TEM image of the vanadium oxide resistor film of Example 1.

A dip coating agent for $V_2O_5$ films (V concentration: 2%) manufactured by Kojundo Chemical Laboratory Co., Ltd. was used as the organovanadium compound, this undiluted solution was spin-coated on a single crystalline $TiO_2$ (001) substrate, and this was thereafter subject to heat treatment at 300° C. for 10 minutes. The solvent in the coating film was removed by the foregoing heat treatment, but the organic constituent bound to vanadium was not removed completely. Subsequently, the film on the substrate was irradiated by KrF excimer laser light (wavelength of 248 nm) under the following conditions; namely, 10 mJ/cm$^2$, 10 Hz, for 5 minutes, in the atmosphere, and at room temperature. When the obtained resistor film was evaluated via the X-ray diffraction method, as evident from FIG. 1, no peak other than the one caused by the substrate could be confirmed, and it was confirmed that crystallization had not sufficiently progressed. In addition, when the temperature variations of electric resistance were measured via the four-terminal methods, as evident from FIG. 2, metal-to-insulator transition caused by $VO_2$ was observed in the vicinity of room temperature, and hysteresis of a resistance change caused by increasing or decreasing temperature was small at approximately 0.6K based on the temperature width defined above. The TCR was calculated from the temperature variations of resistance and is shown in FIG. 3. The TCR indicated 11%/K, which is the maximum value, in the vicinity of 295K, and it was further confirmed that the TCR maintained 4%/K or higher over a temperature range from 270 to 312K. Moreover, the electric resistivity in the vicinity of this temperature was within the range of 0.01 to 10 cm, and was within the range of electric resistivity that is required in a bolometer material. When comparing the vanadium oxide resistor film of this Example to a $VO_2$ thin film having high crystallinity, the electric resistance change along with metal-to-insulator transition is small, but it possesses a high TCR at ±20K in the vicinity of room temperature, and is superior in the respect that the hysteresis of a resistance change caused by increasing or decreasing temperature is extremely small. In addition, since the electric resistance is also within an appropriate range, it can be said that the vanadium oxide resistor film of the Example is extremely superior as a bolometer material. The structure of this resistor film has, based on a cross-section TEM image, a gradient structure of a crystalline phase in the vicinity of the substrate interface, and a gradient structure of a noncrystalline phase in the vicinity of the topmost surface of the thin film (FIG. 4).

Example 2

Figure 5:
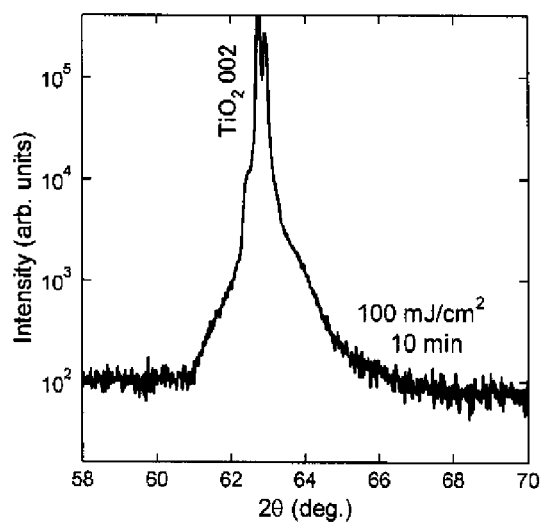
FIG. 5 This is an X-ray diffraction diagram of the vanadium oxide resistor film of Example 2.
Figure 6:
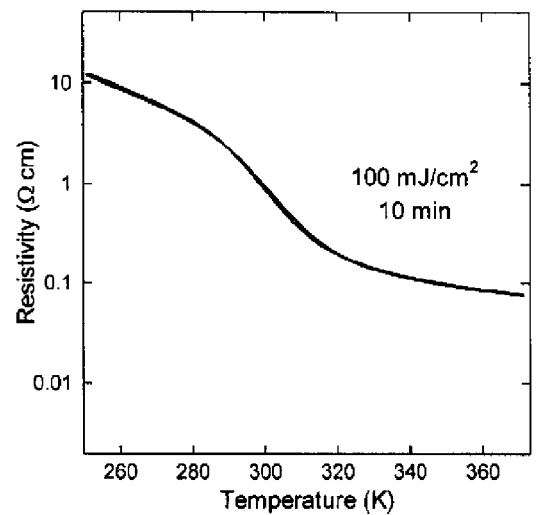
FIG. 6 This is a diagram showing the temperature-based resistance change of the vanadium oxide resistor film of Example 2.
Figure 7:
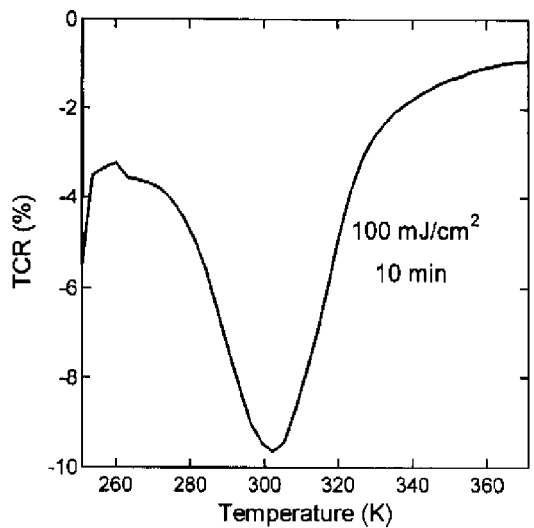
FIG. 7 This is a diagram showing the temperature-based TCR change of the vanadium oxide resistor film of Example 2.

A dip coating agent for $V_2O_5$ films (V concentration: 2%) manufactured by Kojundo Chemical Laboratory Co., Ltd. was used as a metal organic compound, this undiluted solution was spin-coated on a single crystalline $TiO_2$ (001) substrate, and this was thereafter subject to irradiation via an ultraviolet lamp having a wavelength of 222 nm for 60 minutes. The solvent in the film was removed by the foregoing ultraviolet irradiation, but the organic constituent bound to vanadium was not removed completely. Subsequently, KrF excimer laser light (wavelength of 248 nm) was irradiated on the substrate under the following conditions; namely, 100 mJ/cm$^2$, 10 Hz, for 10 minutes, in the atmosphere, and at room temperature. When the obtained resistor film was evaluated via the X-ray diffraction method, as with Example 1, no peak other than the one caused by the substrate could be confirmed, and it was confirmed that crystallization had not sufficiently progressed (FIG. 5). In addition, when the temperature variations of electric resistance were measured, as with Example 1, metal-to-insulator transition caused by $VO_2$ was observed in the vicinity of room temperature, and hysteresis of a resistance change caused by increasing or decreasing temperature was small at approximately 1.3K based on the temperature width defined above (FIG. 6). The TCR indicated 9.6%/K which is the maximum value, in the vicinity of 302K, and it was further confirmed that the TCR maintained 4%/K or higher over a temperature range from 275 to 320K (FIG. 7). Moreover, the electric resistivity in the vicinity of this temperature was within the range of 0.1 to 10 Ωcm, and was within the range of electric resistivity that is required in a bolometer material.

Example 3

Figure 8:
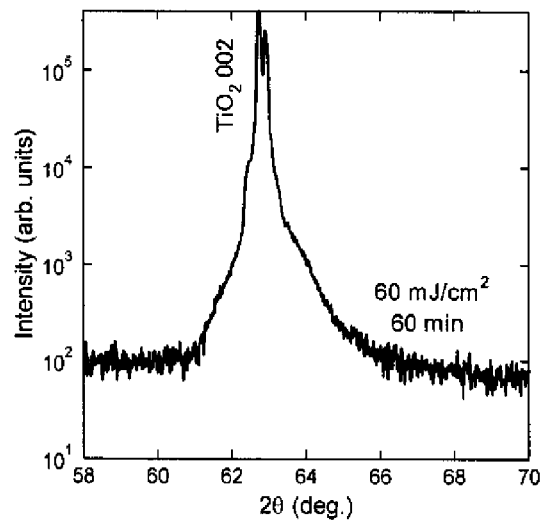
FIG. 8 This is an X-ray diffraction diagram of the vanadium oxide resistor film of Example 3.
Figure 9:
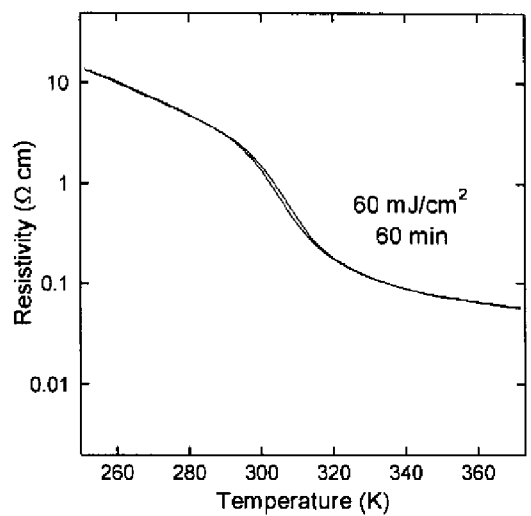
FIG. 9 This is a diagram showing the temperature-based resistance change of the vanadium oxide resistor film of Example 3.
Figure 10:
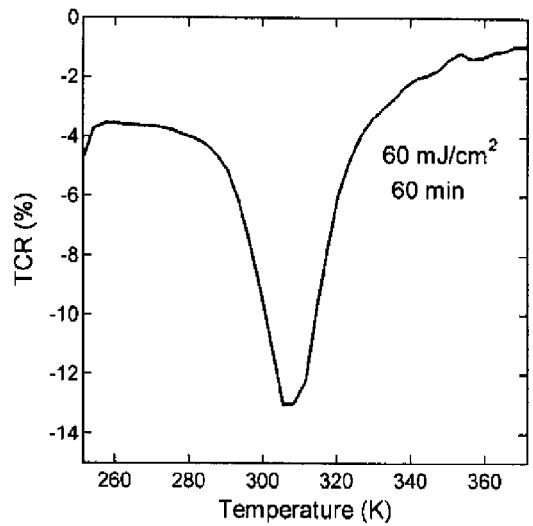
FIG. 10 This is a diagram showing the temperature-based TCR change of the vanadium oxide resistor film of Example 3.

In Example 2, a vanadium oxide resistor film was obtained as with Example 2 other than that the coating film was irradiated by the KrF excimer laser light at 60 mJ/cm$^2$ for 60 minutes. When the obtained resistor film was evaluated via the X-ray diffraction method, as with Examples 1 and 2, crystallization had not sufficiently progressed (FIG. 8). In addition, when the temperature variations of electric resistance were measured, as with Examples 1 and 2, metal-to-insulator transition caused by $VO_2$ was observed in the vicinity of room temperature, and hysteresis of resistance change caused by increasing or decreasing temperature was small at approximately 1.3K based on the temperature width defined above (FIG. 9). The TCR indicated 13%/K, which is the maximum value, in the vicinity of 305K, and it was further confirmed that the TCR maintained 4%/K or higher over a temperature range from 280K to 323K (FIG. 10). Moreover, as with Examples 1 and 2, the electric resistivity in the vicinity of this temperature was within the range of 0.1 to 100 cm, and was within the range of electric resistivity that is required in a bolometer material.

Comparative Example 1

Figure 11:
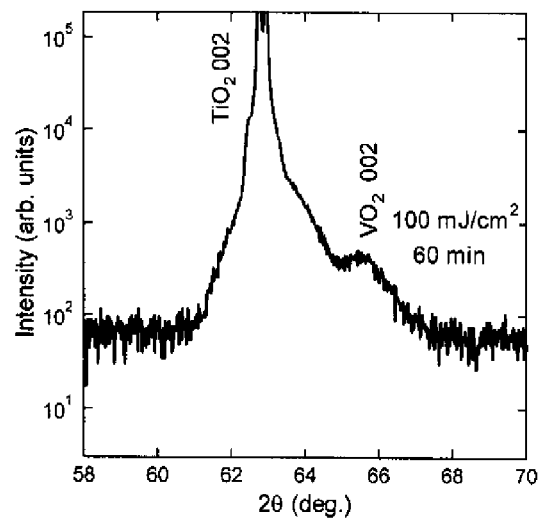
FIG. 11 This is an X-ray diffraction diagram of the vanadium oxide resistor film of Comparative Example 1.

In Example 1, a vanadium oxide resistor film was obtained as with Example 1 other than that the time to irradiate the KrF excimer laser light on the coating film was to be 60 minutes. When the obtained resistor film was evaluated via the X-ray diffraction method, as evident from FIG. 11, a peak caused by $VO_2$ was observed in addition to a peak caused by the substrate, and it was confirmed that crystallization to the $VO_2$ phase was sufficiently occurring.

Figure 12:
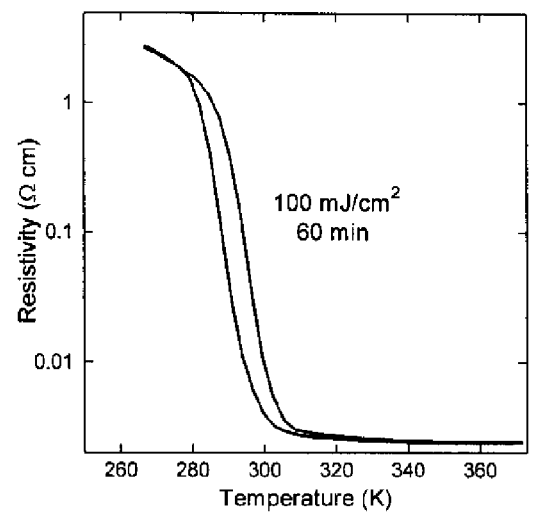
FIG. 12 This is a diagram showing the temperature-based resistance change of the vanadium oxide resistor film of Comparative Example 1.

In addition, when the temperature variations of electric resistance were measured, as evident from FIG. 12, metal-to-insulator transition caused by $VO_2$ was observed in the vicinity of room temperature. The metal-to-insulator transition had a large electric resistance change caused by the foregoing transition, but the hysteresis of a resistance change caused by increasing or decreasing temperature had spread up to approximately 5.8K based on the temperature width defined above. When the temperature width of hysteresis is wide as described above, its application for use as a bolometer material is difficult.

Figure 13:
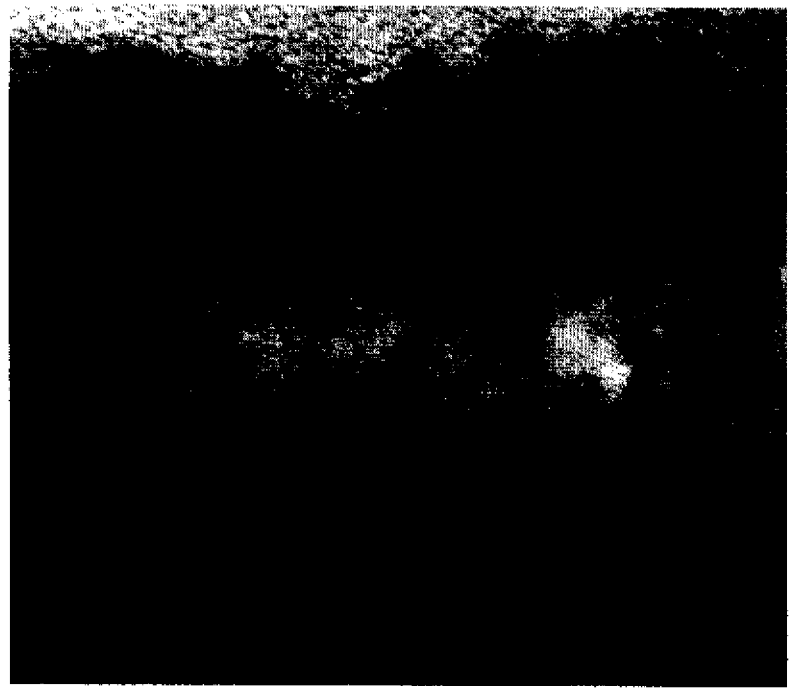
FIG. 13 This is a diagram showing a cross-section TEM image of the vanadium oxide resistor film of Comparative Example 1.

Moreover, the structure of the resistor film of Comparative Example 1 has, based on a cross-section TEM image, a uniform crystalline structure from the substrate interface up to the vicinity of the topmost surface of the thin film (FIG. 13).

The vanadium oxide resistor film of Comparative Example 1 has large hysteresis in a resistance change caused by increasing or decreasing temperature, and its application for use as a bolometer material is difficult. Meanwhile, the vanadium oxide resistor films of Examples 1 to 3 have a small temperature width of hysteresis at less than 1.5K, and the reason why these were extremely superior as a bolometer material is considered to be a result of the difference in crystallinity.

Example 4

Figure 14:
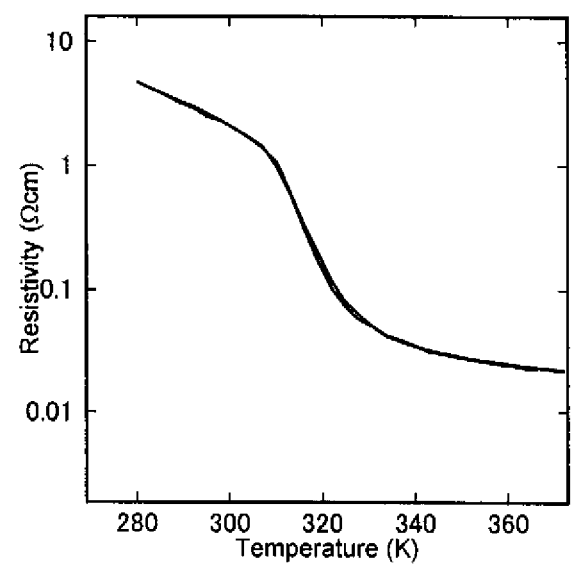
FIG. 14 This is a diagram showing the temperature-based resistance change of the vanadium oxide resistor film of Example 4.
Figure 15:
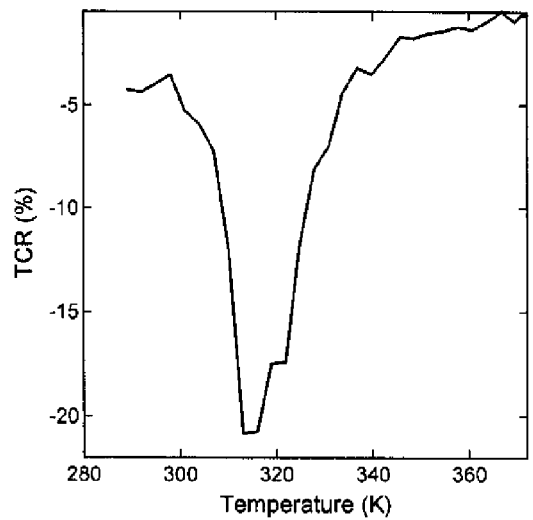
FIG. 15 This is a diagram showing the temperature-based TCR change of the vanadium oxide resistor film of Example 4.

An undiluted solution of a dip coating agent for $V_2O_5$ films (V concentration: 2%) manufactured by Kojundo Chemical Laboratory Co., Ltd. was diluted 8 fold with xylene manufactured by Wako Pure Chemical Industries, Ltd. to use as the metal organic compound, the diluted solution was spin-coated on a single crystalline $TiO_2$ (001) substrate, and this was thereafter subject to heat treatment in the atmosphere at 300 degrees for 10 minutes. Subsequently, KrF excimer laser light (wavelength of 248 nm) was irradiated on the substrate under the following conditions; namely, 100 mJ/cm², 10 Hz, for 60 minutes; and an epitaxial $VO_2$ film having a thickness of roughly 4 nm was thereby prepared. In addition, a solution obtained by diluting an undiluted solution on a dip coating agent for $V_2O_5$ films 1.14 fold with xylene was spin-coated on the epitaxial $VO_2$ film, and this was thereafter subject to heat treatment in the atmosphere at 300 degrees for 10 minutes. In order to prevent crystallization of the film formed on the epitaxial $VO_2$ film from proceeding, KrF excimer laser light (wavelength of 248 nm) was irradiated at 60 mJ/cm² and 10 Hz, for 3 minutes, and a noncrystalline vanadium oxide film having a thickness of roughly 28 nm was formed on the foregoing epitaxial $VO_2$ film. The process of laser irradiation was entirely performed in the atmosphere at room temperature. When the temperature variations of electric resistance of the obtained thin film were evaluated, as evident from FIG. 14, metal-to-insulator translation caused by $VO_2$ was observed in the vicinity of room temperature, and the width of hysteresis of the transition was small at roughly 1.0K. The TCR (absolute value) indicated, as evident from FIG. 15, 20.8%/K which is a maximum value, in the vicinity of 313K. In addition, it was confirmed that the TCR maintained 4%/K or higher over a temperature range from 300 to 335K. Moreover, the electric resistance in the vicinity of this temperature was 10 Ωcm or less, and was within the range of the electric resistivity that is required in a bolometer material. Accordingly, even with a method of separately forming the lower epitaxial $VO_2$ phase and the upper amorphous phase, it is possible to realize extremely superior properties as a bolometer material.

Example 5

Figure 16:
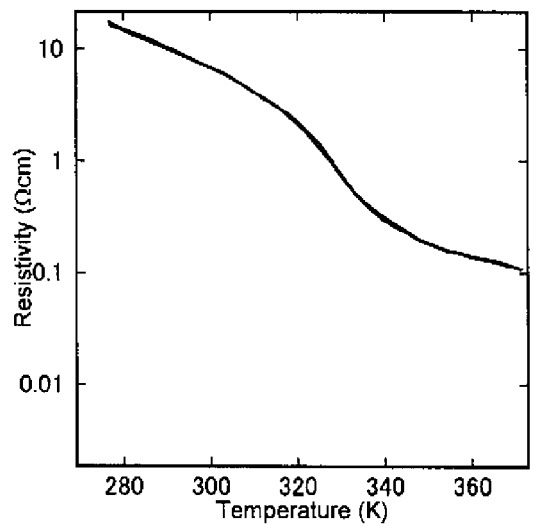
FIG. 16 This is a diagram showing the temperature-based resistance change of the vanadium oxide resistor film of Example 5.
Figure 17:
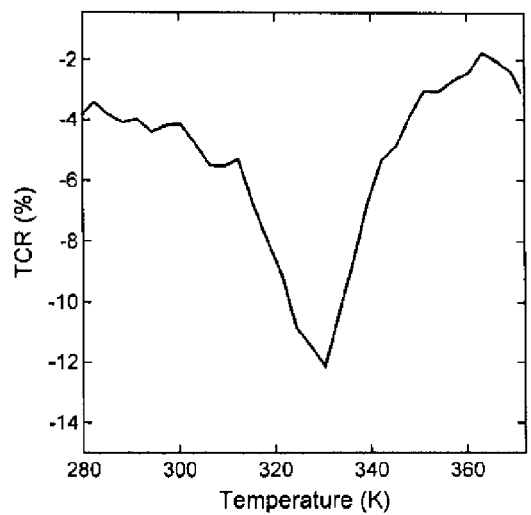
FIG. 17 This is a diagram showing the temperature-based TCR change of the vanadium oxide resistor film of Example 5.

In Example 4, a thin film including the lower epitaxial $VO_2$ film having a thickness of roughly 2 nm and the upper non-crystalline vanadium oxide film having a thickness of roughly 30 nm was formed as with Example 4 other than diluting the dip coating agent for $V_2O_5$ films 16 fold with xylene upon forming a lower epitaxial $VO_2$ film, and diluting the dip coating agent for $V_2O_5$ films 1.07 fold with xylene upon forming an upper noncrystalline vanadium oxide film. When the temperature variations of electric resistance of the obtained thin film were evaluated, as evident from FIG. 16, metal-to-insulator transition caused by $VO_2$ was observed in the vicinity of room temperature, and the width of hysteresis of the transition was small at roughly 0.8K. The TCR (absolute value) indicated, as evident from FIG. 17, 12.1%/K, which is a maximum value, in the vicinity of 330K. In addition, it was confirmed that the TCR maintained 4%/K or higher over a temperature range from 294 to 345K. Moreover, the electric resistance in the vicinity of this temperature was 10 Ωcm or less, and was within the range of the electric resistivity that is required in a bolometer material. Accordingly, since it is possible to change the temperature range indicative of a high TCR value based on the manufacturing conditions, it is possible to prepare a wide variety of bolometer materials depending on the usage as a result of suitably selecting the manufacturing conditions.

INDUSTRIAL APPLICABILITY

The resistor film of the present invention comprising vanadium oxide as a main component is characterized in that a high TCR along with metal-to-insulator transition is indicated at ±20K in the vicinity of room temperature, there is no hysteresis in a resistance change in response to temperature variations or the temperature width of hysteresis is extremely small at less than 1.5K even if there is hysteresis, and the electric resistance is within an appropriate range; and therefore the resistor film of the present invention is extremely superior as a high-precision bolometer material for use in an uncooled infrared sensor. Moreover, due to the foregoing physical properties, the resistor film of the present invention comprising vanadium oxide as a main component can also be broadly applied to various high-precision sensors for detecting temperature and heat such as temperature sensors and thermosensitive sensors in addition to bolometer uncooled infrared sensors.

The invention claimed is:

1. A bolometer comprising a resistor film comprising vanadium oxide as a main component, wherein the vanadium oxide consists of a crystalline phase thereof and a noncrystalline phase thereof co-existing in the resistor film.

2. The bolometer according to claim 1, wherein a metal-to-insulator transition is indicated in electric resistivity variation with change in temperature of the resistor film in a range of temperatures around room temperature, and there exists no hysteresis or, if any, a hysteresis with a temperature width of less than 1.5K in a relation between electric resistivity and temperature of the resistor film.

3. A resistor film comprising vanadium oxide as a main component, wherein the vanadium oxide consists of a crystalline phase thereof, a noncrystalline phase thereof, and a boundary layer co-existing in the resistor film, the boundary layer being a mixture of the crystalline and non-crystalline phases located between a part of the resistor film formed of the crystalline phase and a part of the resistor film formed of the non-crystalline phase, the boundary layer having a gradient in content of each of the crystalline and noncrystalline phases along a thickness of the boundary layer.

4. A temperature sensor comprising the resistor film according to claim 3.

5. The resistor film comprising vanadium oxide as a main component according to claim 3, wherein the crystalline phase is formed in a part of the resistor film on a side of the resistor film facing a base material supporting the resistor film, and the noncrystalline phase is formed in another part of the resistor film on a surface side of the resistor film.

6. The resistor film comprising vanadium oxide as a main component according to claim 3, wherein there exists no hysteresis or, if any, a hysteresis with a temperature width of less than 1.5K in a relation between electric resistivity and temperature of the resistor film, and the relation has a temperature coefficient of resistivity of 4%/K or higher at a temperature in a range of 280K to 320K.

7. The resistor film comprising vanadium oxide as a main component according to claim 3, wherein a metal-to-insulator transition is indicated in electric resistivity variation with change in temperature of the resistor film in a range of temperatures around room temperature, and there exists no hysteresis or, if any, a hysteresis with a temperature width of less than 1.5K in a relation between electric resistivity and temperature of the resistor film.

8. A method of producing the resistor film according to claim 3, wherein a coating film of an organovanadium compound is subject to one or more treatments selected from ultraviolet irradiation treatment using an ultraviolet lamp, heat treatment, plasma irradiation treatment, and laser irradiation treatment.

9. The method of producing the resistor film according to claim 8, wherein the coating film of an organovanadium compound is subject to any of ultraviolet irradiation treatment using an ultraviolet lamp, heat treatment or plasma irradiation treatment, and thereafter it is further subject to laser irradiation treatment.

10. A method of producing the resistor film according to claim 5, wherein a crystalline phase-based lower layer comprising vanadium oxide as a main component is formed, and a noncrystalline phase-based upper layer comprising vanadium oxide as a main component is thereafter formed on the crystalline phase-based lower layer.

11. The method of producing the resistor film according to claim 10, wherein a coating film of an organovanadium compound is subject to one or more treatments selected from ultraviolet irradiation treatment using an ultraviolet lamp, heat treatment, plasma irradiation treatment, and laser irradiation treatment so as to form a crystalline phase-based lower layer comprising vanadium oxide as a main component, a coating film or an organovanadium compound is thereafter formed on the crystalline phase-based lower layer, and the coating film is subject to one or more treatments selected from ultraviolet irradiation treatment using an ultraviolet lamp, heat treatment, plasma irradiation treatment, and laser irradiation treatment so as to form a noncrystalline phase-based upper layer comprising vanadium oxide as a main component.

12. A detector film, comprising a resistor film and a substrate which supports the resistor film, the resistor film comprising vanadium oxide as a main component, wherein the vanadium oxide consists of a crystalline phase thereof and a in the resistor film, and wherein the substrate is a single crystalline or an oriented polycrystalline material selected from the group consisting of sapphire, titanium oxide, and tin oxide.

13. The detector film according to claim 12, formed by a process comprising the steps of irradiating ultraviolet light or plasma onto an organovanadium compound film coated on a surface of the substrate surface to decompose the organic constituent and obtain a noncrystalline phase-based film.

14. The detector film according to claim 13, wherein the process further comprises the step of irradiating laser onto the noncrystalline phase-based film.

15. The detector film according to claim 12, wherein the crystalline and non-crystalline phases are mixed in a boundary layer between the part of the resistor film formed of the crystalline phase and the part of the resistor film formed of the non-crystalline phase, and the boundary layer has a gradient in content of each of the two constituent phases along a thickness of the boundary layer.

* * * * *

UNITED STATES PATENT AND TRADEMARK OFFICE
CERTIFICATE OF CORRECTION

PATENT NO.       : 8,871,363 B2
APPLICATION NO.  : 13/393556
DATED            : October 28, 2014
INVENTOR(S)      : Tetsuo Tsuchiya et al.

It is certified that error appears in the above-identified patent and that said Letters Patent is hereby corrected as shown below:

In the Specification

Column 6, line 53, "by hysteresis" should read "by being subject to laser irradiation treatment or the like, there will be no hysteresis"

In the Claims

Column 14, line 11, "and a" should read "and a noncrystalline phase thereof co-existing"

Signed and Sealed this
Tenth Day of February, 2015

Michelle K. Lee
*Deputy Director of the United States Patent and Trademark Office*